(12) United States Patent
Beikler et al.

(10) Patent No.: US 12,379,327 B2
(45) Date of Patent: Aug. 5, 2025

(54) HIGH PRECISION VPD-DC SCAN

(71) Applicant: PVA TePla AG, Wettenberg (DE)

(72) Inventors: Robert Beikler, Wettenberg (DE);
William Mande, Wettenberg (DE);
Walter Boehme, Wettenberg (DE)

(73) Assignee: PVA TEPLA AG, Wettenberg (DE)

( * ) Notice: Subject to any disclaimer, the term of this patent is extended or adjusted under 35 U.S.C. 154(b) by 571 days.

(21) Appl. No.: 17/941,032

(22) Filed: Sep. 9, 2022

(65) Prior Publication Data

US 2023/0118379 A1 Apr. 20, 2023

(30) Foreign Application Priority Data

Oct. 14, 2021 (DE) ...................... 10 2021 126 728.5

(51) Int. Cl.
*G01N 21/95* (2006.01)
*G01N 35/10* (2006.01)
*H01L 21/67* (2006.01)

(52) U.S. Cl.
CPC ..... *G01N 21/9501* (2013.01); *G01N 35/1011* (2013.01); *H01L 21/67288* (2013.01); *G01N 2021/9511* (2013.01)

(58) Field of Classification Search
CPC ............... G01N 1/02; G01N 2001/028; G01N 2021/9511; G01N 21/9501; G01N 35/1011; H01L 21/67051; H01L 21/6708; H01L 21/67288
See application file for complete search history.

(56) References Cited

U.S. PATENT DOCUMENTS

| | | | |
|---|---|---|---|
| 9,196,471 B1 * | 11/2015 | Choo | ................ H01L 21/68742 |
| 2007/0204881 A1 | 9/2007 | Wakuda et al. | |
| 2008/0121027 A1 | 5/2008 | Hanson et al. | |
| 2012/0260750 A1 | 10/2012 | Lee | |

FOREIGN PATENT DOCUMENTS

| | | | |
|---|---|---|---|
| CN | 110634762 A | * | 12/2019 |
| CN | 213546269 U | | 6/2021 |
| DE | 112005001550 T5 | | 5/2007 |
| JP | 2000019084 A | | 1/2000 |
| KR | 10-20120107190 A | | 10/2012 |
| KR | 10-2019-0047216 A | | 5/2019 |

OTHER PUBLICATIONS

Search Report issued in corresponding German Patent Application No. 10 2021 126 728.5 dated May 24, 2022 (7 pages).
Office Action issued in corresponding Korean Patent Application No. 10-2022-0131686 issued Mar. 24, 2025 (13 pages).
Office Action issued in corresponding Korean Patent Application No. 10-2022-0131686 dated Sep. 1, 2024 (with English translation)(10 pages).
Office Action issued in corresponding Taiwanese Patent Application No. 111129574 dated Aug. 24, 2023 (8 pages).

* cited by examiner

*Primary Examiner* — Jennifer Wecker
(74) *Attorney, Agent, or Firm* — Kilyk & Bowersox, P.L.L.C.

(57) ABSTRACT

The invention relates to a method and system for performing VPD-DC on wafer surfaces, wherein the pipette substitutes for the function of the scan tube and is operated such that a bulge of scanning liquid protrudes from the pipette channel and contacts the wafer surface for scanning.

20 Claims, 3 Drawing Sheets

HIGH PRECISION VPD-DC SCAN

Figure 1:
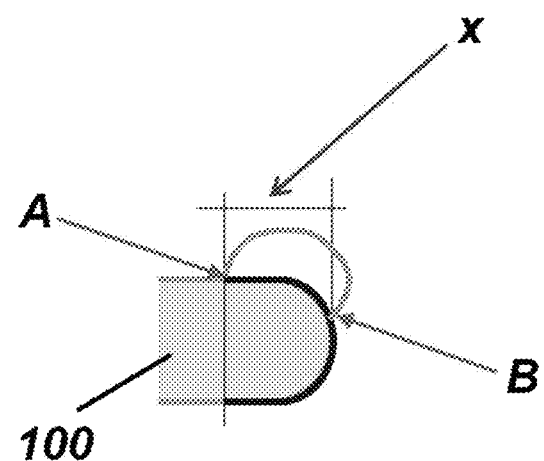

This application claims priority to German Patent Application No. 10 2021 126 728.5, filed Oct. 14, 2021, incorporated in its entirety by reference herein.

The invention relates generally to wafer processing and, more specifically, to the analysis of impurities in wafers.

The progress in semiconductor industry puts stringent demands on the purity of wafers, e.g. silicon wafers, with specifications often going beyond the sensitivities going beyond routine analytical techniques. VPD-DC (vapour phase decomposition-droplet collection) is a sample preparation method used for concentrating impurities on wafer surfaces and improve the sensitivity of subsequent analytical methods.

In a first step of a VPD-DC, the surface oxide of a wafer is etched in an HF (hydrogen fluoride) gas atmosphere. Subsequently a small liquid droplet is scanned over the wafer surface to collect and pre-concentrate surface impurities within the droplet. Wet chemical analysis by means of, for example, inductively coupled plasma mass spectrometry (ICPMS) or atomic absorption spectroscopy (AAS) can be performed on this sample. Alternatively, the droplet can be dried for dry sample analysis like total reflection X-ray fluorescence analysis (TXRF).

A major improvement in handling this laborious procedure in practice was the development of fully automated systems, which allow performing cassette-to-cassette VPD-DC processing. These systems comprise two or three process modules to accommodate etching, scanning and, optionally, drying, next to a cassette station and a robot module for wafer transfer. The process module for scanning usually comprises a rotating wafer stage, or scan table, a pipette for droplet deposition, and a scan tube for taking the droplet and guiding it over the wafer surface. Once the freshly etched wafer is placed on the scan table, aligned and flat/notch oriented the scanning procedure is started. The pipette deposits a droplet of scanning liquid on the wafer surface. The scan tube then takes up the droplet and guides it over the wafer surface as appropriate, e.g. in a spiral trace or in a trace to cover only rings of the surface. After completion of the scan, the pipette again sucks up the scanning liquid, then loaded with the solutes, and transfers it for further analysis.

In a variant of VPD-DC, called bevel scan, the scanning liquid is guided only along the wafer edge/bevel in a circular trace. In this variant, the droplet is not deposited on the wafer surface, but on a droplet holder, essentially in the form of a small concave plateau, which is placed under the circumferential edge line of the wafer. The droplet is then fixed between the scan tube and the droplet holder and the wafer edge touches the fixed droplet from the side while the wafer is rotated on the scan table.

Due to an inherent minimum size and deformation ability of the droplets, a precise scan of only thin bands, e.g. only a 1 mm wide band at the upper bevel surface, has so far not been meaningfully possible. The ability for scanning very precise and confined bands and areas, however, has become interesting in some applications.

The present invention aims to provide a system and method that allows scanning very precise and confined bands and areas.

Against this background the invention relates to a method of performing VPD-DC on wafer surfaces, comprising the steps of: a) placing an etched wafer on a rotatable scan table; b) positioning a pipette and the wafer relative to each other such that the pipette tip is in close proximity, but not in contact with the wafer surface; c) operating the pipette such that a bulge of scanning liquid protrudes from the pipette channel and contacts the wafer surface; and d) rotating the wafer to guide the scanning liquid bulge protruding from the pipette channel along the wafer surface.

Hence, in contrast to the prior art, the invention does not deposit a droplet of scanning liquid in the wafer surface, or a droplet holder in the case of a bevel scan, and does not use a scan tube to guide the drop across the water surface or along the wafer edge. It rather relies on only a liquid bulge protruding from but never leaving the pipette tip, and not deposited on the wafer surface or a droplet holder. A separate scan rod is not necessary as the pipette assumes its function.

The reliance on only a liquid bulge protruding from the pipette tip, in contrast to a full drop, allows a very careful control of the scanned area and the reduction of the minimum width of a band that can be scanned. For example, the method allows to scan very thin, e.g. smaller 2 mm or even smaller 1 mm wide bands at the upper bevel surface of the wafer, which can be desirable in some applications. In some embodiments, the present invention also makes it possible to use much smaller liquid volumes for analysis as in previous droplet-based methods, because there is no inherent lower limit to the liquid volume imposed by the droplet.

The wafers can be silicon wafers, but the invention is also applicable to any other type of wafer.

The scanning liquid for VPD-DC in general is typically an aqueous solution of HF and $H_2O_2$.

In one embodiment, the method is a bevel scan VPD-DC. In this embodiment, in step b), the pipette and the wafer are positioned relative to each other such that the pipette tip is in close proximity, but not in contact with the wafer bevel. In step d), the wafer is rotated to guide the scanning liquid bulge protruding from the pipette channel along the wafer bevel.

Generally, but in particular in the case of a bevel scan VPD-DC, it can be preferred that the pipette tip is bevelled to create an angled pipette channel opening. The angle can correspond approximately to the angle of the wafer bevel. This leads to an improved wetting of the wafer bevel within the inventive concept.

In other embodiments, especially if a full or partial scan of the flat surface of the wafer is desired, the pipette tip will preferably be even.

The use of only a bulge protruding from the pipette for the scan process requires very high precision with regard to the relative positioning of the pipette tip and the wafer.

For that purpose, the method can comprise, in addition to a coarse centering of the wafer on the scan table using a line-scan camera, an advanced centering using a camera with high sensitivity, which allows determination of the position of the wafer edge in xy plane or the pipette tip in xz plane with an accuracy of smaller 10 µm, preferably smaller 8 µm, or even smaller 5 µm. The high sensitivity camera is preferably a 2D camera. The method can also make use of such high sensitivity camera to fine-tune the relative positions of the pipette tip and the wafer edge/bevel. For any fine tuning changes of relative positions, using the shuttle system of the scan table can be preferred over using robot arms due to the higher achievable precision in movement.

In one embodiment, the bulge contour can be monitored with the high sensitivity camera. The pictures can be analysed to determine the success rate of the scan, for example whether there was a tear in the film forming between the bulge and the wafer surface. Next to indicating whether the scan was successful the pictures also convey information whether the volume of the bulge changed during the scan.

In addition, because wafers can be imperfect and not ideally circular, to further improve the precision especially in bevel scans, the method can comprise an ongoing adaption of the relative positions of the scan table and the pipette during the scan, based on pre-recorded pictures from the high sensitivity camera. For the ongoing adaption, likewise, using the shuttle system of the scan table is preferred.

In one embodiment, the volume of the bulge is adjusted during the scan to account for an assumed volume decrease of the liquid bulge due to evaporation, or an assumed volume increase of the bulge due to humidity pickup. In the case of monitoring the bulge contour, as previously described, the volume of the bulge can also be adjusted on the basis of information extracted from the picture during the scan to account for an actual volume decrease or increase of the bulge.

Against the background initially described, the invention further relates to a system for performing VPD-DC on wafer surfaces, the system comprising a scanning module, the scanning module comprising: a rotable scan table for placing an etched wafer thereon; a pipette for bringing a scanning liquid into contact with the bevel of a wafer placed on the scan table; and a control unit configured to operate the scan table and the pipette such as to carry out a method of the invention.

Next to the scanning module, the system may further comprise an etching module and, optionally, a drying module. Typically, the system further comprises a cassette station. A robot for wafer transfer can be shared between the modules, or the system can comprise two or more robots (or robot arms). The system can also comprise means for wet probe analysis, like inductively coupled plasma mass spectrometry (ICPMS) or atomic absorption spectroscopy (AAS), or dry probe analysis, like total reflection X-ray fluorescence analysis (TXRF). The system is preferably fully automated and comprises a common control unit, operatively connected to all parts of the system.

The scan table is usually associated with a shuttle for movement of the scan table in a horizontal plane. Likewise, the system usually comprises a robot for manipulating the pipette and moving it either three-dimensionally or in a plane having a vertical component.

As already described in connection with the inventive method, it can be preferred in some embodiments that the pipette tip is bevelled to create an angled pipette channel opening, while in different embodiments, the pipette tip can be even.

In one embodiment, the system can comprise a high precision camera, preferably a 2D camera, which allows determination of the position of the wafer edge in xy plane or the pipette tip in xz plane with an accuracy of smaller 10 μm, preferably smaller 8 μm, or even smaller 5 μm. The view direction of the camera is preferably horizontal and along a tangential line of the wafer when in scan position.

The system may further comprise a droplet holder, preferably in the form of a small concave plateau. The droplet holder may be positioned under the circumferential edge line of the wafer and/or below the pipette tip, when in scan position. It can serve to hold a volume of scanning liquid before the liquid is sucked in by the pipette for purposes of the scan, and collect scanning liquid after the scan.

Figure 2:
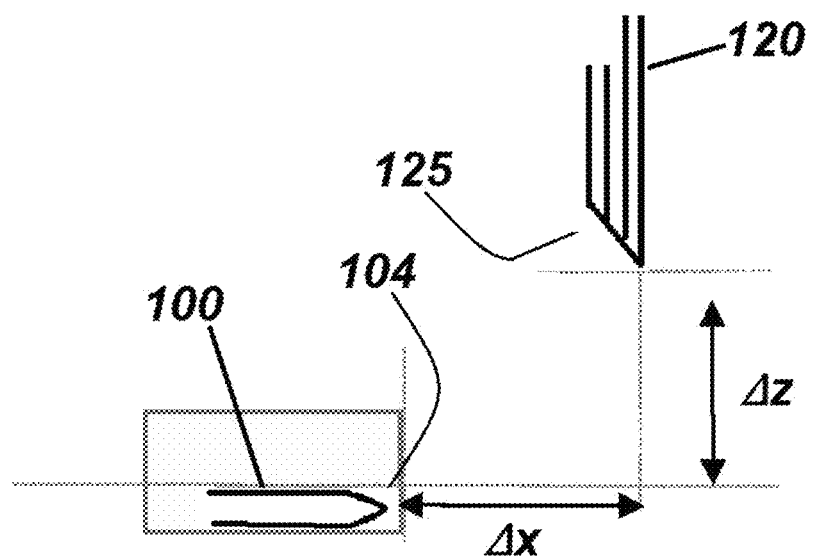
Figure 3:
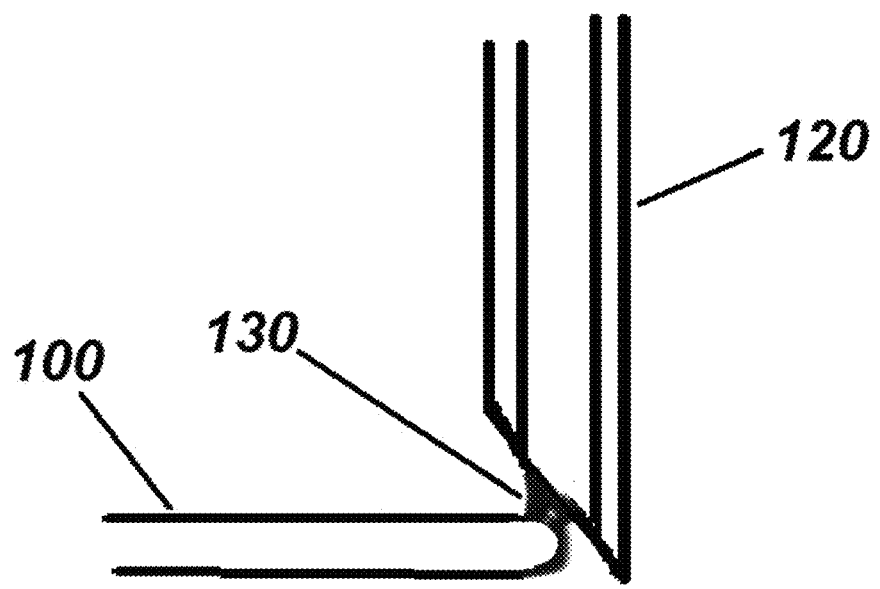

Further details and advantages of the invention are described in the following with reference to a non-limiting example and illustrative figures. The figures show:

FIG. 1: an edge of a wafer and a bevel surface to be scanned in a method according to the invention;

FIG. 2: a side view of the pipette tip and the wafer edge during positioning; and FIG. 3: a side view of the pipette tip with a protruding bulge of scanning liquid touching the wafer bevel during scan.

The example shows a high precision upper bevel scan process and system of the invention to detect surface contamination in wafers. FIG. 1 illustrates a cut view on the edge portion of a wafer 100, where the bevel extending between points A and B and having a width of x, usually around 1 mm, can be recognized.

Initially, the method comprises a step of gross wafer centering on the scan table. In more detail, this step comprises rotating the scan table with the wafer loaded thereon and taking pictures of the wafer edge using a line-scan camera. The system is configured such that a picture is taken every 90° of wafer rotation. The deviations between the wafer edge positions of the four pictures are used to calculate a better position for the wafer on the scan table. To implement the calculated improved position, a robot lifts the wafer and corrects the deviation in x and y direction. The result is controlled again by the line camera and the process repeated if necessary. Once a target accuracy of smaller 200 μm deviation between the most removed wafer edge positions is detected, the gross wafer centering step is completed. There can also be a maximum of iterations, e.g. four iterations, before the step is aborted.

The gross positioning is followed by a fine positioning using a 2D camera with very good resolution of below 70 μm, whose view direction is approximately horizontally and along a tangential line of the wafer. The fine positioning step comprises moving the scan table and the wafer to a so-called bevel position, using a scan table shuttle operating in xy-plane. In the bevel position, the wafer edge is positioned above a droplet holder. The 2D camera then starts capturing a picture of the wafer edge and the wafer rotates for 450°. The captured pictures are analysed to calculate an improved position of the wafer on the scan table. The implementation can essentially be as described in connection with the foregoing step, with the only difference that the target deviation is 80 μm.

The fine positioning is followed by a step of notch positioning, which includes rotating the scan table until the 2D camera finds the notch of the wafer (which is prefabricated into the wafer before the bevel scanning VPD-DC of the invention is performed). Once the notch position is identified, the scan table is rotated until the notch moves to a predefined (angular) start position.

The bevelled tip (dual) pipette and the wafer are subsequently, in a next step, positioned relative to each other. FIG. 2 shows a side view, as viewed from the perspective of the 2D camera, of the tip 125 of the pipette 120 and the bevel 104 of the wafer 100 during this step. For this purpose, the wafer 100 and the pipette 120 are moved to defined raw positions approximating bevel position (wafer) and operative position (pipette). For handling the pipette 120, the system comprises a robot arm. The 2D camera is then used to capture the actual relative positions of the wafer bevel 104 and the pipette tip 125. Based on the picture, the system calculates the distance between wafer bevel 104 and pipette tip 125 in x and z direction. It then compares this measured distance with a defined distance between the pipette tip 125 and wafer bevel 104 in x and z direction. The deviation is converted into motor steps and feedback is given to the motor of the pipette robot arm and the scan table shuttle. The arm and the scan table shuttle, in response to this information, moves in defined directions to approximate the position required. The camera then captures a picture again, which is evaluated again to confirm that there is an appropriate distance between the pipette tip 125 and the wafer bevel 104 in x and z direction. If the position is not yet appropriate, the process is repeated. If appropriate, the pictures is stored as a reference for the position of wafer 100 and pipette 120 during the subsequent scan.

Next, the pipette 120 is used to transfer a predefined amount of fresh scanning liquid, e.g. 50-200 μl, to the droplet holder. It then carries out a rinsing and calibration routine, sucks in the liquid again, and spits back a smaller part of the liquid to avoid any problems resulting from backlash due to a direction change. The pipette 120 is then moved to the defined scan position.

For carrying out the scan process, a small liquid volume of e.g. in the magnitude of 1 μl is forced out of the pipette tip 120 such that a small bulge 130 of scanning liquid protrudes from the pipette channel and contacts the wafer surface. FIG. 3 shows a side view of the pipette tip 125 with the protruding bulge 130 of scanning liquid touching the wafer bevel 104 during this step. The wafer 100 then rotates for a little under 360°, like 355°, to avoid scanning the notch. After the scan, the scan table moves back to default position and the pipette 120 spits out the entire amount liquid contained in the pipette on the droplet holder.

Provision can be made that the volume of the bulge is adjusted during the scan to account for an assumed volume decrease of the liquid bulge due to evaporation, or an assumed volume increase of the bulge due to humidity pickup. For example, an additional volume in the magnitude of 20% of the initial bulge volume can be added every 90° of the scan. The addition or reduction of bulge volume can follow a predetermined scheme, that can be default or based on previous experimentation in a given environment.

During the scan, the bulge contour, or length of the partial droplet protruding from the pipette channel, can be monitored with the 2D camera. The pictures can be analysed to determine the success rate of the scan, for example whether there was a tear in the film connecting the bulge to the wafer surface. In terms of numbers, the length of the bulge reaching from the pipette channel to the wafer surface/bevel, in one embodiment, should preferably remain in the range of 1 mm±1 μm. Next to indicating whether the scan was successful the pictures also convey information whether the volume of the bulge changed during the scan.

In the given context of monitoring the bulge contour, provision can also be made that the monitoring is used to adjust the volume of the bulge on the basis of information extracted from the picture during the scan to account for an actual volume decrease or increase of the bulge.

After the scan, the pipette 120 transfers the liquid comprising the dissolved impurities from the droplet holder to a vial. The liquid can be diluted with either water or another scanning liquid to, for example, 650 μm (ratio 1:4), and further processed. The wafer 100 can be transferred back to an aggregate or another station. The pipette can self-clean and clean the droplet holder with a cleaning solution.

The invention claimed is:

1. A method of performing VPD-DC on wafer surfaces, comprising the steps of:
    a) placing a wafer that is etched on a rotatable scan table;
    b) positioning a pipette and the wafer relative to each other such that a tip of the pipette is in close proximity, but not in contact with a surface of the wafer;
    c) operating the pipette such that a bulge of scanning liquid protrudes from a the pipette channel of the pipette and contacts the wafer surface of the wafer; and
    d) rotating the wafer to guide the bulge of the scanning liquid protruding from the pipette channel along the wafer surface, wherein the method utilizes a bevel scanning VPD-DC for scanning,
    wherein in step b), the pipette and the wafer are positioned relative to each other such that the tip of the pipette is close to a bevel of the wafer but not in contact with the bevel of the wafer, and wherein in step d) said rotating guides the bulge of the scanning liquid bulge protruding from the pipette channel along the bevel of the wafer, and wherein said method comprises centering the wafer on a horizontal scan table using a camera.

2. The method of claim 1, wherein the camera is a 2D camera.

3. The method of claim 1, wherein by centering the wafer on the rotatable scan table a position of an edge of the wafer in an xy plane is determined with an accuracy of below 10 μm.

4. The method of claim 1, wherein the method comprises fine-tuning the relative positions of the pipette tip of the pipette in an xz plane and the bevel of the wafer in the xy plane using the camera, such that a position of an edge of the wafer in an xy plane is determined with an accuracy of below 10 μm.

5. The method of claim 1, wherein the method comprises an ongoing adaption of the position of the rotatable scan table during the scanning of step d), based on pre-recorded pictures from the camera, which allows determination of a position of edge of the wafer with an accuracy of below 10 μm.

6. The method of claim 1, wherein the method comprises monitoring a contour of the bulge during the scanning using the camera which allows determination of the contour with an accuracy of below 10 μm.

7. The method of claim 1, wherein during the scanning in step d) a the volume of the bulge is adjusted to account for an assumed or actual volume decrease or increase of the liquid bulge due to evaporation.

8. A system for performing VPD-DC on wafer surfaces, the system comprising a scanning module, the scanning module comprising:
    a rotable scan table for placing an etched wafer thereon;
    a pipette for bringing a scanning liquid into contact with the bevel of a wafer placed on the scan table; and
    a control unit configured to operate the scan table and the pipette such as to carry out a method of claim 1.

9. The system of claim 8, wherein the pipette tip is bevelled to create an angled pipette channel opening.

10. The system of claim 8, further comprising a high precision camera, which allows determination of the position of the wafer edge in an xy plane or the pipette tip in an xz plane with an accuracy of below 10 μm.

11. The method of claim 3, wherein the accuracy is below 8 μm.

12. The method of claim 4, wherein the camera is a 2D camera.

13. The method of claim 5, wherein the camera is a 2D camera.

14. The method of claim 5, wherein the accuracy is below 8 μm.

15. The method of claim 5, wherein the camera is a 2D camera and wherein the accuracy is below 8 μm.

16. The method of claim 6, wherein the accuracy is below 8 μm.

17. The method of claim 6, wherein the camera is a 2D camera.

18. The system of claim 10, wherein the camera is a 2D camera.

19. The system of claim 10, wherein the accuracy is below 8 μm.

20. The system of claim 10, wherein the accuracy is below 5 μm.

* * * * *